United States Patent [19]
Debnath et al.

[11] Patent Number: 5,742,099
[45] Date of Patent: Apr. 21, 1998

[54] POWER BUS FOR AN INTEGRATED CIRCUIT INCLUDING END-TO-END ARRANGED SEGMENTS PROVIDING POWER AND GROUND

[75] Inventors: Goutam Debnath; Kelly Fitzpatrick, both of Beaverton, Oreg.

[73] Assignee: Intel Corporation, Santa Clara, Calif.

[21] Appl. No.: 821,707

[22] Filed: Mar. 19, 1997

Related U.S. Application Data

[63] Continuation of Ser. No. 314,765, Sep. 29, 1994, abandoned.
[51] Int. Cl.$^6$ ............................................ H01L 23/48
[52] U.S. Cl. ........................................ 257/758; 257/207
[58] Field of Search .................................. 257/202, 203, 257/207, 211, 758, 530, 209, 773, 776, 208, 390

[56] References Cited

U.S. PATENT DOCUMENTS

| | | | |
|---|---|---|---|
| 4,924,287 | 5/1990 | Orbach | 257/209 |
| 4,933,738 | 6/1990 | Orbach et al. | 257/209 |
| 5,111,271 | 5/1992 | Hatada et al. | 257/207 |
| 5,343,058 | 8/1994 | Shiffer, II | 257/207 |

FOREIGN PATENT DOCUMENTS

| | | | |
|---|---|---|---|
| 2-143459 | 6/1990 | Japan | 257/207 |
| 6-13589 | 1/1994 | Japan | 257/207 |

*Primary Examiner*—Jerome Jackson
*Assistant Examiner*—Nathan K. Kelley
*Attorney, Agent, or Firm*—Blakely, Sokoloff, Taylor & Zafman

[57] ABSTRACT

An integrated circuit and a process for manufacturing the same wherein the integrated circuit includes a substrate, a first insulative layer disposed on the substrate, and a first conductive layer disposed on the first insulative layer, the first conductive layer having a plurality of conductive channels arranged into horizontal tracks. The plurality of conductive channels are for providing two power sources $V_{SS}$ and $V_{CC}$ to cells (e.g. standard cells in control blocks) in the integrated circuit. A second insulative layer is disposed on the first conductive layer, and a second conductive layer is disposed on the second insulative layer, the second conductive layer arranged into a plurality of vertical tracks, each of the plurality of vertical tracks are broken into a plurality of segments. Each of the plurality of segments are for carrying one of the power sources, $V_{SS}$ and $V_{CC}$ to the cells in the integrated circuit, each of the plurality of segments coupled to a corresponding channel in the first conductive layer through first vias in the second insulative layer. The integrated circuit may also have a third insulative layer disposed on the second conductive layer, and a third conductive layer disposed on the third insulative layer, the third conductive layer providing interconnection of the segments in each of the vertical tracks through second vias in the third insulative layer, the interconnection provided by horizontal tracks in the third conductive layer. In implemented embodiments, the breaking of the vertical power tracks in the second conductive layer into segments for supplying power to the cells results in a net decrease in the area consumed by power buses in the cells, and thus, more area is available for non-power signal lines. The overall area of the integrated circuit may be thereby reduced.

12 Claims, 3 Drawing Sheets

POWER BUS FOR AN INTEGRATED CIRCUIT INCLUDING END-TO-END ARRANGED SEGMENTS PROVIDING POWER AND GROUND

This is a continuation of application Ser No. 08/314,765, filed Sep. 29, 1994, now abandoned.

BACKGROUND OF THE INVENTION

1. Field of the Invention

The present invention relates to integrated circuit design. Specifically, the present invention relates to a power bus design for use in the design of an integrated circuit, such as a microprocessor.

2. Background Information

In certain complex integrated circuits, such as microprocessors, typically, 20% of the total functional blocks within the integrated circuit are devoted to control logic. Placement and routing for control logic blocks are typically done with the assistance of an automatic layout tool (e.g., the Cell 3 brand automatic layout tool available from Cadence Design of Santa Clara, Calif.). Automatic layout tools typically are useful for laying out such control logic because of its relatively non-complex design in relation to the data path functional blocks of the circuit.

Although automatic layout tools are typically used for the layout of the control blocks in any VLSI design, such tools typically do not yield as high a density of routing as in a hand-drawn layout such as those used for data path functional blocks of a circuit. Even small amounts of savings in area of functional blocks, whether they are hand-drawn or done with the assistance of an automatic layout tool, results in large savings in total area for the entire integrated circuit. Thus, there has arisen a need for increased savings in area of functional blocks, such as those laid out with the assistance of an automatic layout tool.

One prior art technique for laying out power buses to functional blocks, such as control logic in an integrated circuit, is illustrated with reference to 100 of FIG. 1. 100 of FIG. 1 shows a top view of a portion of conductive layers of a prior art power bus for control logic in an integrated circuit. Note that the notation M1, M2, etc. indicates the layer in the integrated circuit at which the conductive layer resides. Thus, M1 refers to the metal 1 layer, M2 refers to the metal 2 layer, and M3 refers to the metal 3 layer. Note that each of the power tracks are coupled to corresponding horizontal tracks for supplying $V_{SS}$ and $V_{CC}$ in the M1 and M3 layers such as 120–131 illustrated in FIG. 1. Each of the horizontal tracks and vertical tracks are interconnected with the appropriate track ($V_{SS}$ or $V_{CC}$) through vias in insulative layers separating the conductive layers M1, M2 and M3. In such a typical prior art design, typically $V_{SS}$ and $V_{CC}$ are supplied via two pairs of vertical tracks (e.g., 110 and 111) in the M2 layer for control logic in the integrated circuit. There is a plurality of pairs of vertical tracks for each of the power sources $V_{CC}$ and $V_{SS}$ to the integrated circuit such as 110–113. Although a typical prior art design such as 100 of FIG. 1 for supplying power is in great use in integrated circuit design today, the amount of area consumed by pairs of vertical tracks is substantial. This consumption of area typically arises as a result of the use of automatic layout tools as used in certain prior art.

SUMMARY AND OBJECTS OF THE INVENTION

Objects of the present invention include providing an improved method for automatic placement and routing of power buses in an integrated circuit which consumes less area for powering standard cells in integrated circuit design, for example, for designing control logic in a microprocessor.

This and other objects of the present invention are provided for by an integrated circuit and a process for manufacturing the same wherein the integrated circuit includes a substrate, a first insulative layer disposed on the substrate, and a first conductive layer disposed on the first insulative layer, the first conductive layer (e.g., metal 1) having a plurality of conductive channels arranged into horizontal tracks. The plurality of conductive channels are for providing two power sources $V_{SS}$ and $V_{CC}$ to cells (e.g. standard cells in control logic) in the integrated circuit. A second insulative layer (e.g., metal 2) is disposed on the first conductive layer, and a second conductive layer is disposed on the second insulative layer, the second conductive layer arranged into a plurality of vertical tracks, each of the plurality of vertical tracks are broken into a plurality of segments. Each of the plurality of segments are for carrying one of the power sources, $V_{SS}$ and $V_{CC}$ to the cells in the integrated circuit, each of the plurality of segments coupled to a corresponding track in the first conductive layer through first vias in the second insulative layer. The integrated circuit may also have a third insulative layer disposed on the second conductive layer and a third conductive layer (e.g., metal 3) disposed on the third insulative layer, the third conductive layer providing interconnection of the segments in each of the vertical tracks through second vias in the third insulative layer, the interconnection provided by horizontal tracks in the third conductive layer. In implemented embodiments, the breaking of the vertical power tracks in the second conductive layer into segments for supplying power to the cells results in a net decrease in the area consumed by power buses in the cells, and thus, more area is available for non-power signal lines. The overall area consumed by the integrated circuit may be thereby reduced.

Other objects, features and advantages of the present invention will be apparent from the description and figures which follow below.

BRIEF DESCRIPTION OF THE DRAWINGS

The present invention is illustrated by way of example and not limitation in the figures of the accompanying in which like references indicate like elements and in which.

DETAILED DESCRIPTION

The present invention relates to the design and fabrication of an integrated circuit, for example, the control logic blocks of a microprocessor. The present invention is described with reference to certain specific embodiments including certain power sources, layers, etc., for example, however, these should in no way limit the present invention. Various modifications may be made, by one skilled in the art, without implementing the specific embodiments described herein.

Thus, these specific embodiments are used for illustration purposes only, and do not limit the present invention.

Figure 1:
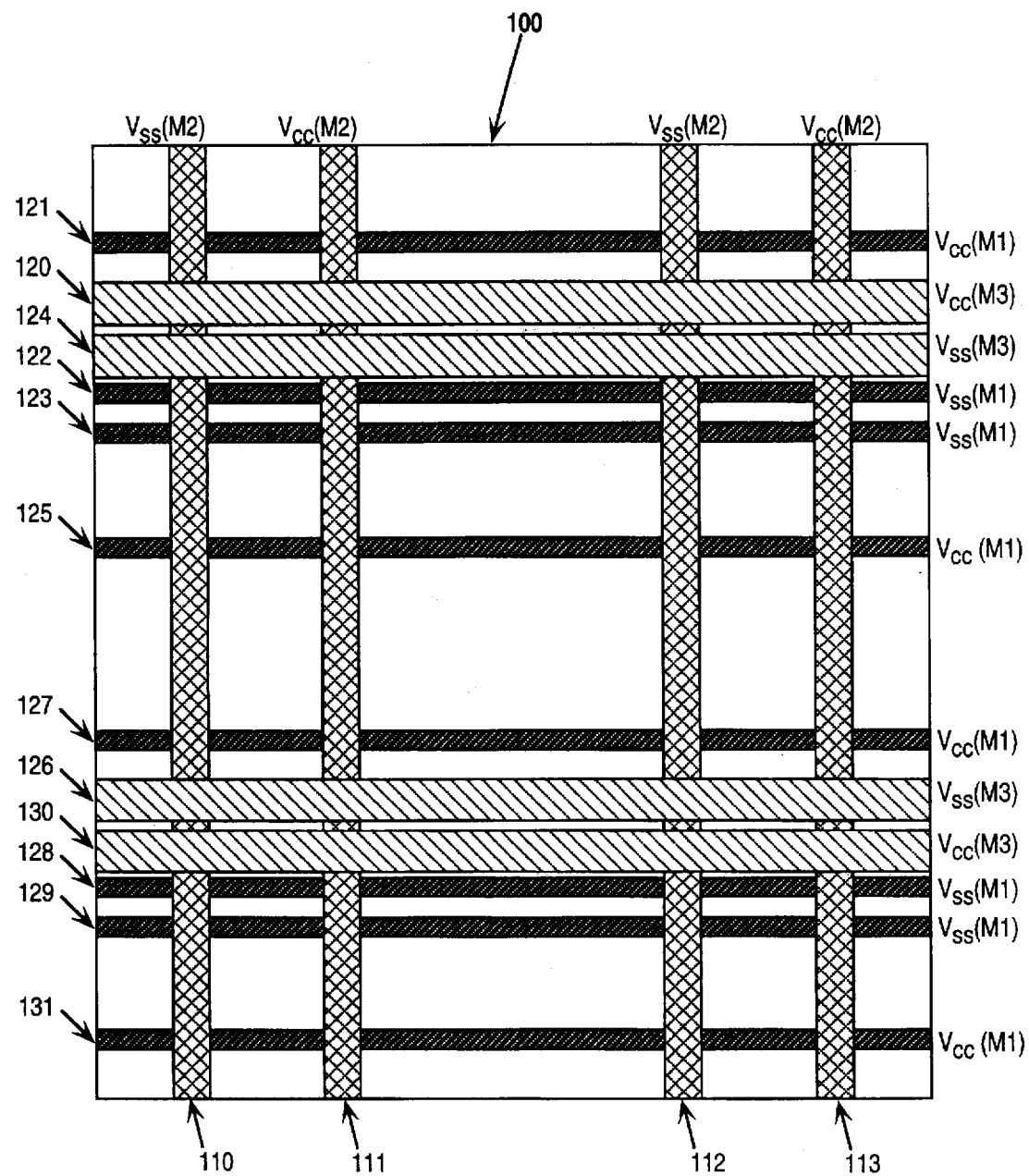
FIG. 1 illustrates a typical prior art power bus design used in integrated circuits, especially for use for control logic blocks designed with the use of an automatic layout tool.
Figure 2:
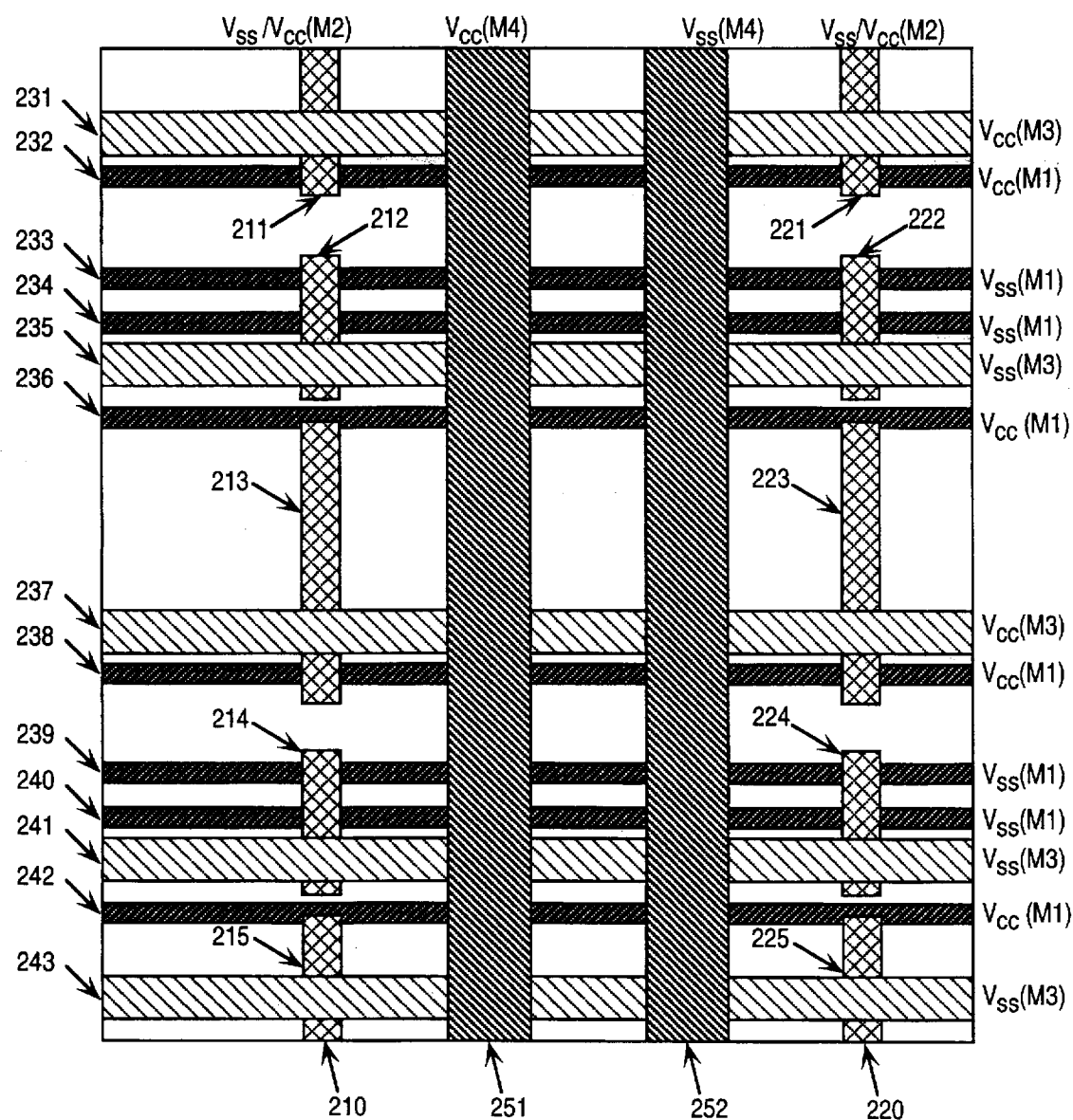
FIG. 2 illustrates a shared power bus layout which may be created with the use of an automatic layout tool, for example, for designing control logic blocks employing standard cells.
Figure 3:
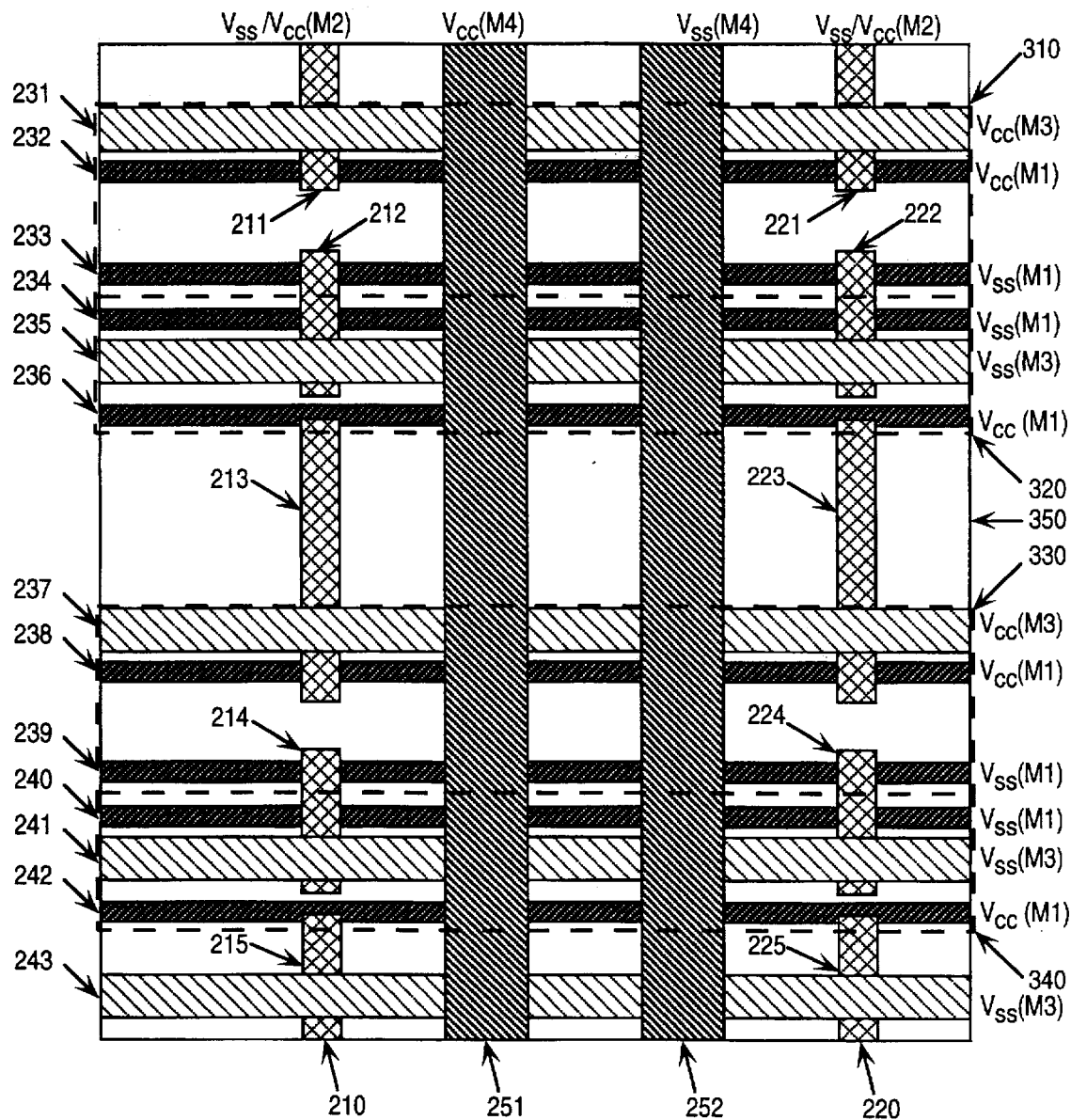
FIG. 3 illustrates the arrangement of rows and double-back rows of standard cells to reduce the amount of area required for carrying power, and thus, the area consumed by the layout.

FIG. 2 illustrates a top view of a portion of a layout of conductive layers of an integrated circuit in implemented embodiments of the present invention. The notation in FIGS. 2 and 3 is the same as in FIG. 1, however, the layout of the circuit is different. As in FIG. 1, the conductive layers are separated by insulative layers on the substrate wherein tracks for $V_{SS}$ and $V_{CC}$ are coupled to the appropriate track through vias in the insulative layers. First, as illustrated, the layout includes the M1, M2 and M3 layers, but also includes an M4 (metal 4) layer comprising vertical tracks 251 and 252 for carrying $V_{CC}$ and $V_{SS}$, respectively. Second, in the M2 (metal 2) conductive layer using prior art layouts, two separate vertical tracks are used for supplying $V_{SS}$ and $V_{CC}$, respectively, for standard cells of control logic in the integrated circuit. In implemented embodiments of the present invention, instead of having pairs of vertical tracks in the M2 (e.g., 110 and 111, or 112 and 113 in FIG. 1), implemented embodiments of the present invention break a single vertical track in the M2 layer into segments for carrying $V_{SS}$ and $V_{CC}$ and providing the necessary interconnection with the M1 and M3 conductive layers. Thus, instead of pairs of vertical tracks, implemented embodiments of the present invention use a single vertical M2 track such as 210 or 220 for both $V_{SS}$ and $V_{CC}$. Thus, vertical track 210 has a plurality of segments 211–215 each of which provides the necessary interconnections to the respective power source ($V_{SS}$ or $V_{CC}$) in the M1 and M3 layers. Thus, segments 211 and 221 provide the necessary interconnections for 231 and 232 for providing $V_{CC}$ to standard cells in the integrated circuit. Segments 212 and 222 of vertical tracks 210 and 220 provide the necessary interconnections for the $V_{SS}$ tracks 233–235.

The vertical tracks 210 and 220 further comprise segments 213, 214, 215, 223, 224 and 225, for interconnecting the necessary M2 and M3 power buses for supplying power to each of the standard cells. Note that $V_{SS}$ and $V_{CC}$, respectively, alternate in the horizontal plane for each of the horizontal tracks of standard cells for the integrated circuit. This is to allow the segments in each of the vertical tracks to provide the necessary interconnection for the same power line in the M1 and M3 layers for each of the standard cells. A detail of the layout of the horizontal tracks of standard cells in relation to the power bus line illustrated in FIG. 2 will be illustrated below with reference to FIG. 3.

The advantage of the single vertical tracks 210 and 220 for supplying each of the separate power sources $V_{SS}$ and $V_{CC}$ is that a 50% M2 area savings for the power bus is attained. A significant area savings in the horizontal plane is achieved by the use of a single vertical track for carrying both $V_{SS}$ and $V_{CC}$. Only a single metal 2 track divided into segments is used in this embodiment for interconnecting each of the power bus lines in the horizontal direction such as 231–243 illustrated in FIG. 2. As a result, more area is available in the M2 layer for other signal lines not used for carrying power. In this way, the overall area consumed by the integrated circuit may be thereby reduced.

FIG. 3 shows the arrangement of rows of standard cells which may be used in conjunction with the power bus layout described with reference to FIG. 2. For example, the pattern for standard cells, such as that used for control logic in a microprocessor, or other circuitry which is designed using an automatic layout tool, is illustrated with reference to FIG. 3. FIG. 3 shows a portion of the horizontal tracks of standard cells, however, the pattern is repeated for as many standard cells as are required to complete the design of the control logic. For example, the layout will comprise a first row of standard cells 310 which is supplied power by the metal 1 horizontal tracks 232 and 233 for $V_{CC}$ and $V_{SS}$, respectively. In addition, a metal 3 line 231 is used for interconnecting $V_{CC}$. Note that the metal 1 line 232 and the metal 3 line 231 are interconnected via segments 211 and 221 of vertical tracks 210 and 220, respectively. Then two additional segments 212 and 222 are used for coupling the $V_{SS}$ lines 233–235. A second row of standard cells 320 known as a "double-back row" is then situated adjacent to the first row 310 for a second row of standard cells in the integrated circuit. The segments 212 and 222 continue from the first horizontal track 310 to interconnect the $V_{SS}$ lines 234 and 235 with the metal 1 line 233 used for powering the first row of standard cells 310.

As is apparent from the figure, the segments in each of the vertical tracks in the metal 2 layer alternate between $V_{SS}$ and $V_{CC}$. In this way, instead of using a pair of vertical tracks for $V_{SS}$ and $V_{CC}$ in the M2 layer, a single vertical track may be used for interconnecting the respective power lines in the M1 and M3 layers, as is illustrated in FIGS. 2 and 3, resulting in a net 50% savings in area in the horizontal plane for the power bus lines. The double-back row 320 further has a M1 track 236 for $V_{CC}$ and segments 213 and 223 are used for interconnecting the $V_{CC}$ buses 236, 237 and 238 in the M1 and M3 layers. That is, the segments 213 and 223 are used for coupling the $V_{CC}$ line 236 in the M1 layer for double-back row 320, and these are then interconnected with the $V_{CC}$ lines 237 and 238 in the next row of cells. Note the channel 350 separating the double-back row 320 and the next row 330 to provide the necessary separation between rows of standard cells in the device. Then, row 330 and double-back row 340 resume the same pattern as illustrated with reference to rows 310 and 320. With segments 214 and 224 interconnecting the $V_{SS}$ lines, and segments 215 and 225 interconnecting the $V_{CC}$ lines for the next double-back row 340.

Thus, in implemented embodiments of the present invention, the vertical tracks in the M2 layer for power buses are broken into segments for interconnecting each of the respective power sources. Thus, using the layouts described with reference to FIGS. 2 and 3, significant savings in area for functional blocks in the horizontal plane may be achieved by using less material and less overall area for conductive channels in the M2 layer in an integrated circuit.

Thus, via the use of single vertical tracks broken into segments for supplying power in the M2 layer, the area consumed by an integrated circuit may be substantially reduced. Although the present invention has particular applications to certain specific embodiments, such as for an automated layout tool for the layout of standard cells for control logic in a microprocessor, this does not limit the present invention. Other modifications may be made by one skilled in the art without departing from the overall spirit and scope of the present invention. Thus, the present invention is to be construed as limited only by the appended claims which follow.

What is claimed is:

1. An integrated circuit comprising:

a substrate;

a first insulative layer disposed on said substrate;

a first conductive layer disposed on said first insulative layer, said first conductive layer having first and second power supply tracks, the first power supply track providing a power connection, and the second power supply track providing a ground connection, to cells in said integrated circuit, a second insulative layer disposed on said first conductive layer; and a second conductive layer disposed on said second insulative layer, said second conductive layer having:

a third power supply track divided into power and ground segments, the power segment of the third power supply track providing a power connection and being coupled to the first power supply track, and the ground segment of the third power supply track providing a ground connection and being coupled to the second power supply track; and a fourth power supply track divided into power and ground segments;

a third insulative layer disposed on said second conductive layer; and a third conductive layer disposed on said third insulative layer, said third conductive layer providing an interconnection between said power segments and between said ground segments of said third and fourth power supply tracks, said interconnection provided by tracks in said third conductive layer.

2. The integrated circuit of claim 1 wherein said third power supply track is divided into a plurality of segments, said plurality of segments comprising alternate power and ground segments.

3. The integrated circuit of claim 1 further comprising:

a fourth insulative layer disposed on said third conductive layer; and a fourth conductive layer disposed on said fourth insulative layer, said fourth conductive layer providing interconnection of said tracks in said third conductive layer by tracks in said fourth conductive layer coupled to said tracks in said third conductive layer through vias in said third insulative layer.

4. A power supply arrangement for use in an integrated circuit, the power supply arrangement comprising:

first and second power supply lines defined within a first conductive layer, the first power supply line providing a power coupling, and the second power supply line providing a ground coupling, within the integrated circuit;

a third power supply line defined within a second conductive layer, the third power supply line being divided into a power segment and a ground segment, the power segment being coupled to the first power supply line and the ground segment being coupled to the second power supply line;

a fourth power supply line defined within the second conductive layer, the fourth power supply line being divided into a power segment and a ground segment; and fifth and sixth power supply lines defined within a third conductive layer, the fifth power supply line coupling the power segments of the third and fourth power supply lines and the sixth power supply line coupling the ground segments of the third and fourth power supply lines.

5. The power supply arrangement of claim 4 wherein the first and second power supply lines extend parallel to a first axis, and the third power supply line extends parallel to a second axis, the first axis being substantially perpendicular to the second axis.

6. The power supply arrangement of claim 4 wherein the third power supply lines is divided into a plurality of segments coupled alternately as power and ground segments.

7. The power supply arrangement of claim 4 including:

a first via coupling the first power supply line to the power segment; and a second via coupling the second supply line to the ground segment.

8. A pair of first and second power supply busses for use within a first conductive layer within an integrated circuit, each of the first and second power supply busses comprising:

a first segment coupled to provide a power coupling to cells within the integrated circuit; and a second segment coupled to provide a ground coupling to the cells within the integrated circuit, wherein the first and second segments of each of the first and second power supply busses are arranged linearly in an end-to-end, spaced relationship, and wherein the first segments are interconnected by a third power supply bus within a second conductive layer, and the second segments are interconnected by a fourth power supply bus within the second conductive layer.

9. The pair of power supply busses of claim 8, wherein each of the first and second power supply busses comprises a plurality of segments arranged linearly in an end-to-end, spaced relationship and coupled alternately as power and ground segments.

10. The pair of power supply busses of claim 8, wherein the first and second power supply busses extends substantially parallel to a first axis, the third and fourth power supply busses extend parallel to a second axis, the first axis being substantially perpendicular to the second axis.

11. A power supply arrangement for use in an integrated circuit, the power supply arrangement comprising:

first and second power supply lines defined within a first conductive layer, the first power supply line providing a coupling to a first power source, and the second power supply line providing a coupling to a second power source, within the integrated circuit; and a third power supply line defined within a second conductive layer, the third power supply line being divided into a first segment and a second segment, the first segment being coupled to the first power supply line and the second segment being coupled to the second power supply line;

a fourth power supply line defined within the second conductive layer, the fourth power supply line being divided into a first segment and a second segment; and fifth and sixth power supply lines defined within a third conductive layer, the fifth power supply line coupling the first segments of the third and fourth power supply lines and the sixth power supply line coupling the second segments of the third and fourth power supply lines.

12. A pair of first and second power supply busses for use within a first conductive layer within an integrated circuit, each of the first and second power supply busses comprising:

a first segment coupled to provide a first power source to cells within the integrated circuit; and a second segment coupled to provide a second power source to the cells within the integrated circuit, wherein the first and second segments of each of the first and second power supply busses are arranged in an end-to-end, spaced relationship, and wherein the first segments are interconnected by a third power supply bus within a second conductive layer, and the second segments are interconnected by a fourth power supply bus within the second conductive layer.

* * * * *